United States Patent
Weyen et al.

(10) Patent No.: US 11,747,378 B2
(45) Date of Patent: Sep. 5, 2023

(54) METHOD AND DEVICE FOR MONITORING INSULATION BETWEEN A DC BUS AND PROTECTIVE EARTH

(71) Applicant: VITO NV, Mol (BE)

(72) Inventors: Dominique Weyen, Mol (BE); Peter Coenen, Mol (BE)

(73) Assignee: VITO N.V., Mol (BE)

( * ) Notice: Subject to any disclaimer, the term of this patent is extended or adjusted under 35 U.S.C. 154(b) by 240 days.

(21) Appl. No.: 17/359,023

(22) PCT Filed: Dec. 23, 2019

(86) PCT No.: PCT/EP2019/086901
§ 371 (c)(1),
(2) Date: Jun. 25, 2021

(87) PCT Pub. No.: WO2020/136157
PCT Pub. Date: Jul. 2, 2020

(65) Prior Publication Data
US 2023/0152358 A1    May 18, 2023

(30) Foreign Application Priority Data
Dec. 27, 2018  (EP) ..................................... 18248091

(51) Int. Cl.
*G01R 27/18*  (2006.01)
*G01R 31/12*  (2020.01)
*G01R 27/02*  (2006.01)

(52) U.S. Cl.
CPC ............ *G01R 27/18* (2013.01); *G01R 27/025* (2013.01); *G01R 31/12* (2013.01)

(58) Field of Classification Search
CPC ....... G01R 27/18; G01R 27/025; G01R 31/01
(Continued)

(56) References Cited

U.S. PATENT DOCUMENTS

| 10,948,532 | B1* | 3/2021 | Li ...................... G01R 31/1245 |
| 2012/0319660 | A1* | 12/2012 | Hagenmaier, Jr. ... G01R 27/025 324/606 |
| 2015/0066399 | A1 | 3/2015 | Kasai |

FOREIGN PATENT DOCUMENTS

| CN | 108333428 A * | 7/2018 | ........... G01R 27/025 |
| DE | 102013209142 A1 * | 11/2014 | ........... G01R 27/025 |

(Continued)

OTHER PUBLICATIONS

International Search Report and Written Opinion—PCT/EP2019/086901—dated Mar. 26, 2020.

*Primary Examiner* — Christopher P McAndrew
(74) *Attorney, Agent, or Firm* — N.V. Nederlandsch Octrooibureau (57) ABSTRACT

A method and device for monitoring insulation between a DC bus and protective earth, wherein the bus is connected with a DC source. Terminals of the source are connected to protective earth by a first electrical network during a first timespan, and transient first electrical values related to the first network at a plurality of time steps in the first timespan are measured. A first steady state value is calculated using a plurality of first measurement points at the plurality of first time steps. Further, the terminals of the source are connected to protective earth by a second electrical network, during a second timespan, and transient second electrical values related to the second network at a plurality of second time steps in the second timespan are measured. A second steady state value is calculated using a plurality of second measurement points at the plurality of second time steps. An indication of insulation resistances between the terminals of the source and protective earth is determined based on the calculated steady state values of the first electrical value and the second electrical value.

26 Claims, 7 Drawing Sheets

(58) Field of Classification Search
USPC .......................................................... 324/551
See application file for complete search history.

(56) References Cited

FOREIGN PATENT DOCUMENTS

| EP | 0833423 | A2 |   | 4/1998  |            |
|----|---------|----|---|---------|------------|
| EP | 1265076 | A1 |   | 12/2002 |            |
| EP | 2717063 | A1 | * | 4/2014  | G01R 27/025 |
| WO | WO-2012098677 | A1 | * | 7/2012 | G01R 27/18 |

* cited by examiner

METHOD AND DEVICE FOR MONITORING INSULATION BETWEEN A DC BUS AND PROTECTIVE EARTH

CROSS-REFERENCE TO RELATED APPLICATIONS

This application is a U.S. National Stage application under 35 U.S.C. § 371 of International Application PCT/EP2019/086901 (published as WO 2020/136157 A1), filed Dec. 23, 2019, which claims the benefit of priority to Application EP 18248091.3, filed Dec. 27, 2018. Benefit of the filing date of these prior applications is hereby claimed. Each of these prior applications is hereby incorporated by reference in its entirety.

FIELD OF THE INVENTION

The invention relates to a method and device for monitoring insulation between a DC bus and a protective earth. The invention further relates to the use of the device for insulation fault monitoring. Furthermore, the invention relates to a system with a DC bus, possibly capacitively coupled to an AC grid, wherein the device is arranged for monitoring the insulation between the DC bus and the protective earth.

BACKGROUND TO THE INVENTION

Direct current (DC) power networks are used in various applications, such as a DC voltage distribution system, electric vehicles, charging stations for electric vehicles, photovoltaics, etc.

Floating DC grids require insulation monitoring as a safety measure for guaranteeing a proper electric insulation between the DC grid and the protective earth. Such insulation resistance monitoring devices can be employed for the detection of insulation faults and failures, before a fault current flows, e.g. through a human body. The device can automatically interrupt and/or disconnect the DC supply voltage upon detection of an insulation fault or failure. An active protection can thus be obtained such that electrocution of users and other personnel can be effectively avoided. The insulation monitoring devices can be compact and can be easily integrated with other devices. Contrary to DC grids, AC grids can be protected by residual current devices. These devices require a fault current to flow before they can act.

Insulation monitoring in DC networks can be performed in several ways. The device can be configured to measure insulation resistance between power lines and a protective earth (e.g. enclosure) in a floating system. Commonly, a small electric excitation is applied between the DC source lines and the protective earth (small DC or AC voltage or current) and the response is observed. This tends to provide adequate results in small DC island grids (e.g. vehicles) with relatively few (known) devices connected therewith.

However, in various applications and DC networks, a larger number of external devices are connected with the DC source. These devices may not be known or defined at design time, and may furthermore contain power electronics that provide some coupling between the protective earth and the power lines for filtering purposes. In larger grids for example, the filters included in the devices can severely disturb the operation of the insulation monitoring devices. In case the DC grid is coupled to the AC grid e.g. via power electronics, the insulation monitoring devices may not operate correctly. For instance, when a DC grid is connected or coupled to the AC grid, an isolation transformer may be used for providing isolation. However, the protective earth may be common for the DC source and the AC grid, such that a fault in the DC grid may not be accurately detected by a residual current device.

There is a need for insulation monitoring which can handle with such situations, and/or which can provide an improved insulation monitoring for a wide variety of DC networks.

SUMMARY OF THE INVENTION

It is an object of the invention to provide for a method and a system that obviates at least one of the above mentioned drawbacks.

Additionally or alternatively, it is an object of the invention to provide an improved insulation monitoring.

Additionally or alternatively, it is an object of the invention to provide an insulation monitoring method and device with an improved safety.

Additionally or alternatively, it is an object of the invention to provide an improved insulation monitoring between a DC bus and the protective earth of an AC grid.

Thereto, the invention provides for a method for monitoring insulation between a DC bus and protective earth, the bus being in connection with a DC source, the method comprising the steps of: connecting terminals of the source to protective earth by a first electrical network during a first timespan; measuring transient first electrical values related to the first network at a plurality of time steps in the first timespan, wherein a first steady state value is calculated using a plurality of first measurement points at the plurality of first time steps; connecting the terminals of the source to protective earth by a second electrical network, during a second timespan; measuring transient second electrical values related to the second network at a plurality of second time steps in the second timespan, wherein a second steady state value is calculated using a plurality of second measurement points at the plurality of second time steps; and determining an indication of insulation resistances between the terminals of the source and protective earth based on the calculated steady state values of the first electrical value and the second electrical value.

Advantageously, the insulation monitoring may be used in a larger range of DC networks. For instance, the insulation monitoring can provide accurate indication of the insulation resistances in case of larger DC grids, and/or DC grids which are coupled to an AC grid. Even if the response of the electric excitation contains a resistor-capacitor (RC) component, the insulation resistances can be determined accurately and in a fast way, thereby also improving the overall safety of the insulation monitoring. The risk for electrocution can thus be reduced.

The protective earth can be excited with two voltage levels one after the other. In many cases and applications, it is desired that the insulation monitoring reacts within 300 ms after an insulation fault has occurred (depending on the fault magnitude) in order to guarantee safety and protect humans against electrocution. The RC time constant of the parasitic capacitances in combination with a high impedance of the resistors used in the excitation may easily exceed 50 ms. Decreasing the RC time constant by lowering the value of the resistors in the excitation circuit can increase the excitation current to a value dangerous to humans. Furthermore, it may be difficult to influence the capacitance C, as it can depend on other devices coupled to the electrical network. It may be undesirable or even unacceptable to wait for 3 to 5 times the RC time constant (which can be 200 ms or more) before taking a measurement, as the total reaction time of the insulation monitoring can then exceed 800 ms According to the invention, the RC response can be monitored over a limited period of time (cf. timespan), and the steady state end values can be estimated or predicted for use in further calculations in order to find the resistive insulation values faster. Different types of models can be used for predicting/estimating the stable end value.

The to be determined insulation resistances between the terminals can be calculated on the basis of voltage measurements (e.g. by means of a microcontroller) obtained when the terminals of the DC source are connected to the protective earth by the first electrical network, and when the terminals of the DC source are connected to the protective earth by the second electrical network.

An indication of insulation resistances may be determined, from which said insulation resistances can be directly or indirectly derived. The calculated value of the resistance values and/or of the parallel resistance values (or indication thereof) can be used for triggering an alarm when an alarm level for the insulation fault is reached.

Optionally, the first and second steady state value is calculated before the measured first and second electrical value has reached steady state in the first and second timespan, respectively. Prior to reaching a stable or steady state value, a model can be employed (e.g. fitting) for calculating or estimating a predicted steady state value, i.e. the steady state value that would have been obtained after a sufficiently long period of time for stabilization.

Thus, instead of waiting for stabilization of the first and second electrical values to a constant and/or stable value (e.g. longer than five times the RC component: 5*RC), a plurality of different measurement points (cf. sampled data points) in a limited first and second timespan can be used for calculating/estimating the end values, respectively. For example, an overall trend can be identified by performing a fit, such that the end value can be accurately determined without requiring an undesired or unacceptable waiting time. As a result, the safety can be significantly improved.

Optionally, the first timespan and/or the second timespan is less than three times a resistive-capacitive (RC) time constant.

A slow response as a result of the resistive-capacitive (RC) delay can be prevented, such that the detection speed of an insulation fault can be improved. The detrimental RC delay plays an important role, as there is often not sufficient time for waiting until a stable steady state end value of the measured first and second electrical value is obtained.

A total time to obtain a steady state end value is 5 times the time constant RC. However, according to the invention only a limited portion of the charge or discharge curve is used for determining the steady state end value. The first and second electrical values may be voltages. As a result of the electrical networks, the voltages can increase at a faster rate during the first time constant and at a lower rate in the last time constant or visa versa. A plurality of measurement points in the charging curve can be used for determining a steady state end value.

The RC constant can vary depending on the resistance obtained when the terminals of the source are connected to the protective earth by the first or second electrical network. Furthermore, the RC constant can vary depending on the capacitance between the protective earth and the positive and negative terminal of the DC. The capacitance may for instance be a parasitic capacitance obtained when the DC source is connected to an AC electrical network.

Optionally, the first and second timespan are chosen taking into account an estimate of the RC constant. This estimate of the RC constant can be preconfigured.

Optionally, the RC constant is determined based on measurement points.

Optionally, the first timespan and/or the second timespan is less than 400 ms, more preferably less than 200 ms, even more preferably less than 100 ms. The sum of the first timespan and the second timespan can be less than 800, more preferably less than 400 ms, even more preferably less than 120 ms.

The first steady state value and second steady state value can be predicted in various ways. For instance, a computational model may be employed configured to predict the steady state end value based on a limited number of measurement points. For example, model fitting, estimator algorithms, machine learning algorithms, etc. may be used.

In some examples, a duration of 400 ms for the first timespan and/or second timespan may be too long, as it may not be possible to react (e.g. alarm) within a time period of 300 ms. Optionally, the first and second timespans are chosen such that a time required for determining the insulation resistances and performing an alarm action is less than 300 ms, more preferably less than 200 ms.

Optionally, the first steady state value is calculated by means of a first curve fit using the plurality of measurement points at the plurality of first time steps, and wherein the second steady state value is calculated by means of a second curve fit using the plurality of measurement point at the plurality of second time steps.

The required time for obtaining an estimate of the steady state value of the measured electrical quantity can be significantly reduced by performing an curve fit. The curve fit may provide an accurate prediction of the steady state value. It may thus no longer be required to wait until the first/second electrical value (e.g voltage) has reached a steady state value (a full period in a cycle). Based on the predicted final value, an indication of the insulation resistances may be determined. It is also possible that instead of an indication, the insulation resistances are calculated directly and/or indirectly.

Optionally, a time interval between successive time steps is selected based on the power line cycle.

The protective earth can be capacitively coupled to the AC lines so the voltage on the protective earth can follow a grid frequency or higher harmonics thereof. Measuring during any whole number of power line period or cycle can effectively average out the effects of this detrimental coupling.

Optionally, the time interval is selected as a multiple of the power line period, preferable equal to one power line period.

The measurement points used for predicting the first and second steady state value can be chosen with a distance n multiples of a powerline cycle duration of the AC grid. The powerline cycle is 20 ms (cf. 50 Hz) in Europe, and 16.7 ms (cf. 60 Hz) in the United States.

Optionally, three measurement points are used for each of the first curve fit and the second curve fit.

The curve fit may be an exponential fit utilizing at least three measurement points. By employing three measurement points, three equations can be obtained with three unknowns. Other curve fitting methods may also be performed, for instance involving least squares or Levenberg- Marquart. It will be appreciated that it is possible that more than three measurement points are used for performing the curve fit.

The way the measured electric values are handled, for example in a microcontroller, may be chosen such that a better accuracy is obtained. By choosing an asymmetric ratio, such as ⅓ and ⅔, the calculation (formulas) and the way the measured electric values are handled (e.g. in microcontroller) may be greatly simplified. In this way, also the accuracy may be improved. Moreover, symmetrical faults can be detected.

Optionally, the first electrical value and the second electrical value are measured at a same measurement location, with respect to a same reference, wherein the excitation voltages are normalized to a DC line voltage provided by the DC source.

The measured response to the excitation voltages can be normalized to the DC source voltage when used in the calculation of the insulation voltage. The excitation voltages can be scaled to the DC voltage. The scaling may be implemented in a microcontroller. Optionally, the excitation voltages are linearly proportional to the DC voltage. By dividing the DC source voltage by a same factor as first electrical voltage value and the second electrical voltage value, and using the first as a reference for the A/D converter, more than one A/D channel may no longer be required. Furthermore, the calculation time can be reduced as the ratios are measured directly by the AD converter.

The DC voltage (Vdc) can be used as a reference. Advantageously, it may no longer be needed to divide by a total voltage. A greater accuracy can be obtained, and a full scale of the measuring range can be used. Further, the DC voltage may experience variations to some extent. By measuring in relative terms (e.g. ⅓, ⅔), inaccuracies as a result of a varying DC voltage can be overcome. The arrangement of the resistances in the electrical network may result in the asymmetric ratios of ⅓ and ⅔. It will be appreciated that other ratios may also be used.

Optionally, the reference voltage Vref is generated internally in a microcontroller using the DC source voltage or direct supply voltage of the microcontroller.

Optionally, during the first timespan the protective earth is excited with a block voltage of a first fraction of the DC line voltage, and wherein during the second timespan the protective earth is excited with a block voltage of a second fraction of the DC line voltage, wherein the first fraction is different from the second fraction. Advantageously, the monitoring also works with a symmetrical insulation fault on the positive and negative terminal of the DC source. A symmetrical insulation fault with an identical insulation failure on the positive and negative voltage terminal can be detected. In DC systems, the likelihood of this type of failure happening is not uncommon. In an example, a symmetric fault can occur if there is a fault in the DC power source itself, at an intermediate voltage level in a stacked DC source. Furthermore, a symmetric fault can also be introduced when the DC bus is loaded with a motor inverter and when an insulation failure occurs after the inverter (e.g. in an electric vehicle). Degradation of insulating materials may also lead to symmetrical faults.

Optionally, the sum of the first fraction and the second fraction is substantially equal to one. Optionally, the first fraction is ⅓ and the second fraction ⅔.

The accuracy and computing time can be improved by employing dimensionless values (e.g. ⅓ and ⅔). In order to be able to measure volt, such that the ratio ⅓, ⅔ can be measured directly, a reference value (Vref) can be used for an AD converter. The reference value Vref can be defined as the DC source voltage divided by a number for obtaining a sufficiently low voltage which can be used with the microcontroller. In such a case, the Vref can vary with the DC source voltage. The ratio between V1 (i.e. the first electrical value) and the DC source voltage can be measured directly. Vref can be the reference voltage for the AD conversion.

The first electrical value (e.g. voltage V1) and the second electrical value (e.g. voltage V2) can be measured at different points of time in which the DC voltage has varied. In case the DC voltage is not known (e.g. not measured), both V1 and V2 would be divided by the same number. This can be overcome by working with dimensionless fractions (instead of absolute voltages) in the measurements.

Optionally, one or more biasing resistances are used for increasing the first fraction and decreasing the second fraction, wherein the one or more biasing resistances are configured to provide a biasing of 0.1-2%, more preferably between 0.1-1%.

The biasing resistors can enable compensation for component tolerances (cf. use cheaper components). To further increase noise immunity bias resistors can be introduced such that a first excitation voltage (Vx1) is slightly larger than the first fraction (e.g. ⅓ Vdc) and the second excitation voltage (Vx2) is slightly smaller than the second fraction (e.g. ⅔ Vdc). The result is that Vx2−Vx1 is smaller than Vdc/3 in all circumstances considering injected noise and component tolerances. Advantageously, the bias resistors can result in a lower insulation resistance estimate (i.e. safe) when the resistance is high and can be negligible error inn the estimate in case of insulation faults. An error can be made on the insulation measurement if the insulation value is rather large. However, the measurement can still be accurate if the insulation value becomes small, i.e. when an insulation fault occurs.

Optionally, a filter is employed for measuring the first electrical value and the second electrical value, wherein the filter is a low pass filter.

Filters can be used to filter noise or crosstalk. However, in some cases, such filters (e.g. filter configured for filtering a 50 Hz or 60 Hz component and optionally their harmonics) may introduce (further) unwanted delays, for example in the order of magnitude of milliseconds in the electrical measurements. Additionally, a detrimental phase shift may be introduced in the measured results. However, by employing a high-frequency filter, the delay and phase shifts can be limited, while an improved signal is obtained.

The calculation of the steady state end value of the transient first and second electrical values can be done in various ways.

Optionally, the steady state electrical values are calculated using curve fitting only when the DC source is coupled to an AC network.

The method may further include determining whether the DC source is coupled to the AC network. In case there is a coupling to an AC network, the first and second electrical value may be calculated/predicted. Waiting until the steady state value is reached may take too long as a result of the RC constant (cf. capacitive coupling). In case there is no coupling to an AC network, the steady state first and second electrical value may be directly measured. This can be performed sufficiently fast as there is no RC delay. Optionally, an operation mode can be manually selected.

Optionally, a switch is provided switchable between a first state and a second state, wherein in the first state the switch connects the terminals of the source to the first network, and wherein in the second state the switch connects the terminals of the source to the second network, wherein said first and second timespans are equal, and wherein the sequence of said first and second timespan is repeated with a fixed frequency, and wherein said steps of measuring, calculating and comparing are repeated with said same frequency.

Optionally, the determined insulation resistances (R1, R2) are compared to predefined alarm levels, wherein an alarm action is performed when the insulation resistances exceed predetermined levels.

Optionally, the device of the invention is equipped with means for sending a signal to a load connected to the DC source, in case of an insulation failure, for communicating said failure to remote control stations.

Optionally, the transient first electrical value and the transient second electrical value is measured with a ratiometric A/D conversion. Advantageously, no fixed reference is required as a result.

Optionally, the DC voltage of the DC source is measured. Additionally or alternatively, an indication of the DC voltage is provided to the microcontroller.

According to an aspect, the invention provides for a device for monitoring insulation between a DC bus and protective earth, the bus being in connection with a DC source, wherein the device is configured to: connect terminals of the source to protective earth by a first electrical network during a first timespan; measure transient first electrical value related to the first network at a plurality of time steps in the first timespan, wherein a first steady state value is calculated using a plurality of first measurement points at the plurality of first time steps; connect the terminals of the source to protective earth by a second electrical network, during a second timespan; measure transient second electrical values related to the second network at a plurality of second time steps in the second timespan, wherein a second steady state value is calculated using a plurality of second measurement points at the plurality of second time steps; and determine an indication of insulation resistances between the terminals of the source and protective earth based on the calculated steady state values of the first electrical value and the second electrical value.

Advantageously, the device can operate correctly even when the electrical network to be monitored is a DC network coupled to an AC grid via a capacitive coupling (e.g. in a charging station for an electrical vehicle). The resulting capacitance obtained due to the capacitive coupling can significantly influence the measurement of the electric quantities, e.g. voltage. The RC constant can form a significant delay until a steady state end value is reached. When a block voltage is applied, a delayed square wave may be obtained. The device can respond sufficiently fast to detect insulation faults even with the presence of said RC time constant resulting from the capacitive coupling.

Additionally, the device can also be used in a DC network not coupled to an AC grid. In both cases, an accurate indication of the insulation resistances can be determined.

The device may include a microcontroller configured for controlling a switch between an 'on' and an 'off' state, wherein in the 'on' state the terminals of the source are connected to the protective earth by the first electrical network, and wherein in the 'off' state the terminals of the source are connected to the protective earth by the second electrical network. Depending on the state of the switch, the first and second electrical values (e.g. two voltages) can be measured. An additional voltage measurement may be performed for measuring the DC voltage produced by the DC source.

Optionally, the device is configured to perform other monitoring functions.

It will be appreciated that the insulation resistances R1 and R2 are physically present, but not in the form of a resistance component. A fault resistance may be seen as a resistance because it behaves electrically as a resistance.

It will be appreciated that any of the aspects, features and options described in view of the method apply equally to the device, and/or vice versa. It will also be clear that any one or more of the above aspects, features and options can be combined.

BRIEF DESCRIPTION OF THE DRAWING

The invention will further be elucidated on the basis of exemplary embodiments which are represented in a drawing. The exemplary embodiments are given by way of non-limitative illustration. It is noted that the figures are only schematic representations of embodiments of the invention that are given by way of non-limiting example.

In the drawing.

DETAILED DESCRIPTION

Figure 1:
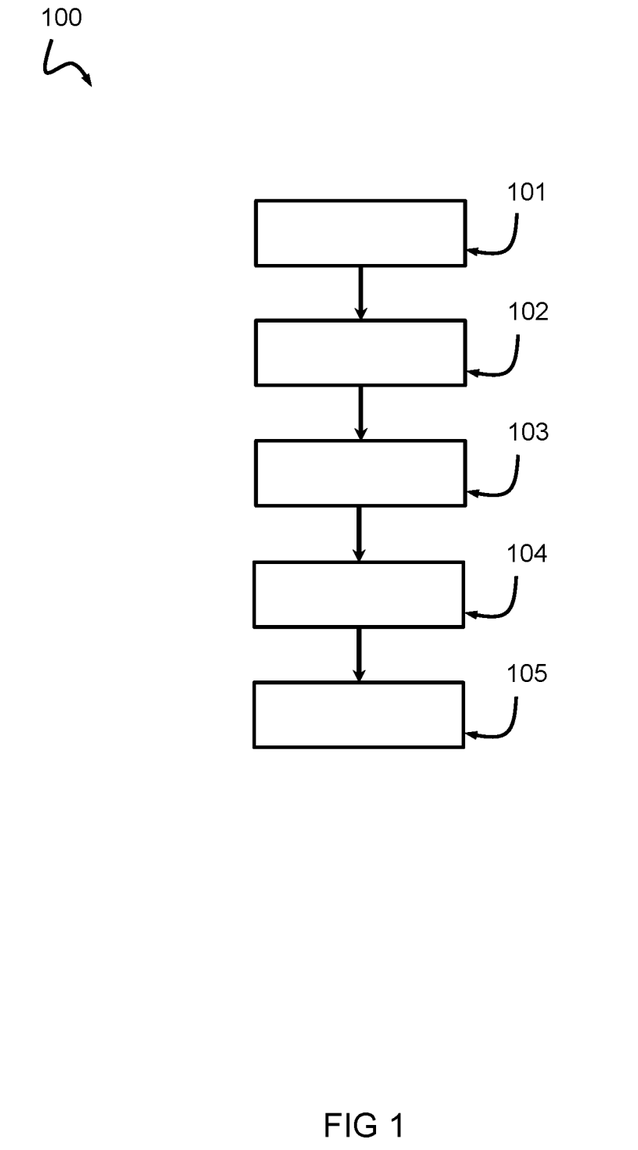
FIG. 1 shows a schematic diagram of a method.

FIG. 1 shows a schematic diagram of a method 100 for monitoring insulation between a DC bus and protective earth, the bus being in connection with a DC source. In a first step 101, terminals of the source are connected to protective earth by a first electrical network during a first timespan. In a second step 102, transient first electrical values related to the first network are measured at a plurality of time steps in the first timespan, wherein a first steady state value is calculated using a plurality of first measurement points at the plurality of first time steps. In a third step 103, the terminals of the source are connected to protective earth by a second electrical network, during a second timespan. In a fourth step 104, transient second electrical values related to the second network are measured at a plurality of second time steps in the second timespan, wherein a second steady state value is calculated using a plurality of second measurement points at the plurality of second time steps. In a fifth step 105, an indication of insulation resistances between the terminals of the source and protective earth is determined based on the calculated steady state values of the first electrical value and the second electrical value.

In case the DC source is connected to an AC electrical network, there may exist a parasitic capacitance between the protective earth and the positive and negative terminal of the DC. The capacitance may be unknown and change over time. The capacitance may for instance depend on devices connected to the AC grid. As a result of the capacitive coupling, the time required for reaching a steady state end value may be too long (unacceptable for safety).

There may exist a significant delay before the first electrical value and the second electrical value has reached a stable end value. The delay depends on the time constant equal to R*C. The R value (resistance) is relatively large for obtaining limited leakage currents. The C value (capacitance) can be relatively large as a result of devices connected to the electrical network. In case of a relatively large RC value, it can take too long for obtaining a steady state end value. For instance, 3 to 5 times the time constant RC may be unacceptable with regard to safety and/or certain applications. By predicting the first and second steady state end values, for example by performing curve fitting of the RC curves, a faster and more accurate response may be obtained.

Figure 2:
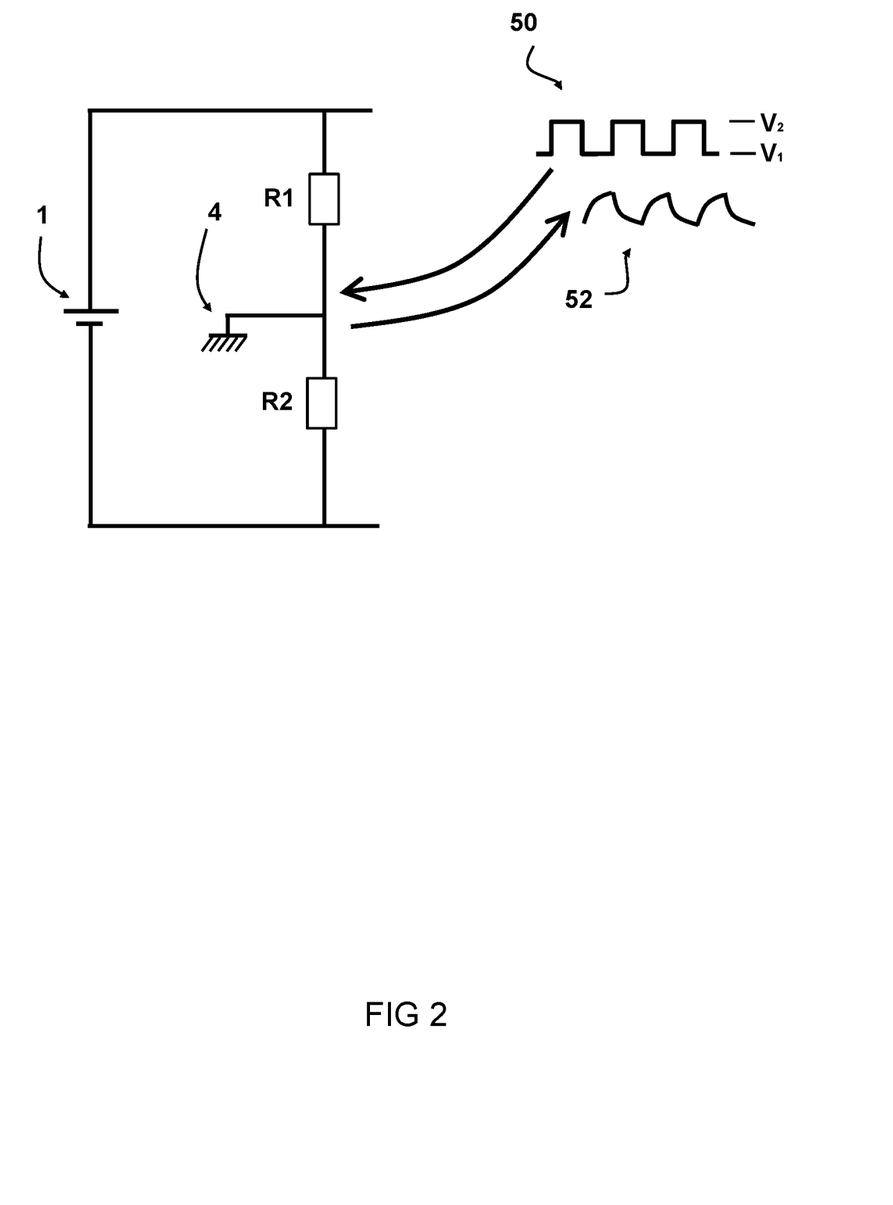
FIG. 2 shows a schematic diagram of an embodiment of a DC bus and protective earth.

FIG. 2 shows a schematic diagram of an embodiment of a DC bus and protective earth. The DC bus is in connection with a DC source 1. Terminals of the source 1 is connected to the protective earth 4. The insulation resistances are represented by R1 and R2. By connecting the source 1 to the protective earth 4 via a first network (not shown in this figure), a first excitation can be applied. By subsequently connecting the source 1 to the protective earth 4 via a second network (not shown in this figure), a second electrical excitation can be applied. The electric excitation 50 can be performed by applying two different DC voltages V1, V2 determined by configuration of first network and second network). Electrical values related to the first network and the second network 52 are measured for a limited period of time, wherein based on measurement points at a plurality of time steps, a steady state (stable) value is predicted, limiting the required for calculating the insulation resistances R1 and R2.

In this example, a square wave voltage is applied (excitation), but the measured voltage is not a square wave as a result of the capacitance. If the applied voltage is maintained for a longer period of time, the steady state end value may be reached, however, with regard to safety, at this point it may be too late for triggering an alarm. Therefore, the steady state value is predicted in a limited timespan smaller than the time needed for reaching steady state (cf. smaller than 5*RC).

Figure 3A:
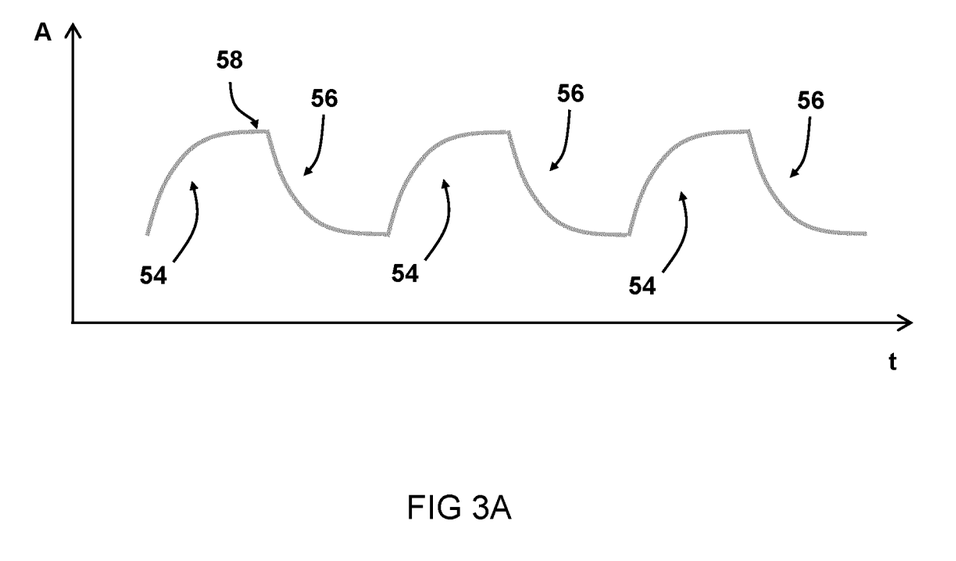
FIGS. 3a and 3b show a schematic diagram of a measured transient electrical value in function of time.
Figure 3B:
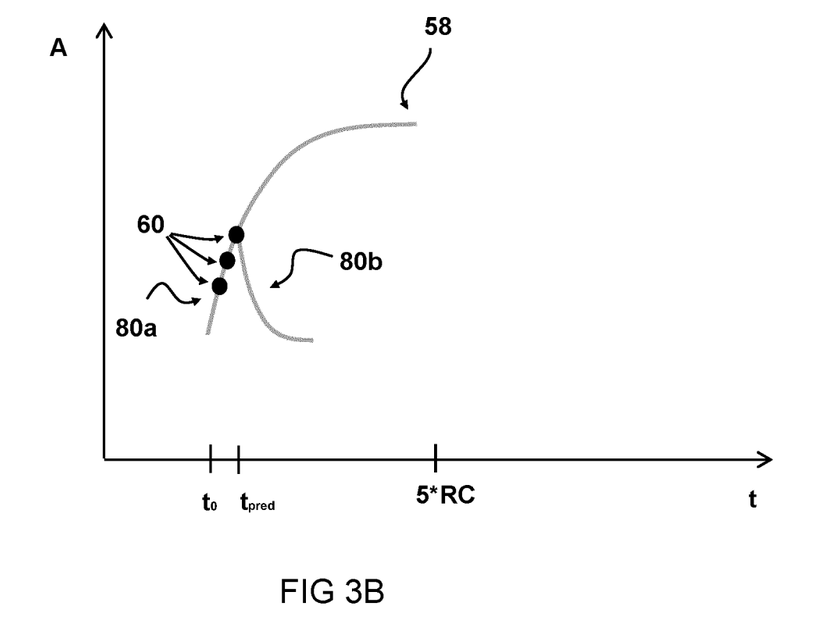

FIGS. 3a and 3b show a schematic diagram of a measured transient electrical value, with amplitude A, in function of time t. FIG. 3a shows an alternating sequence of transient second electrical values 54 related to the second network, followed by transient first electrical values 56 related to the first network. As mentioned above, there may exist a coupling between the protective earth and the AC grid, resulting in a capacitance. When terminals of the DC source are connected to protective earth by the second electrical network the measured voltage may increase gradually (as a result of the RC delay) until the steady state value 58 is reached.

As a result of the resulting RC circuit, the voltage rises in function of time in a charging phase towards the applied voltage (excitation). If the excitation voltage is reduced, a discharge phase is obtained with a falling voltage. The voltage discharges towards the new excitation voltage. The voltage increases at the fastest rate during the first time constant and the least in the last during charge. Similarly, the voltage decreases at the fastest rate during the first time constant and the least in the last during discharge. The charge and discharge curve can reached into 5 time constants, i.e. the point at which a substantially stable or steady state end value is reached.

FIG. 3b shows an enlarged view, wherein the steady state value is calculated using three measurement points 60. These measurement points 60 are used for predicting/estimating the steady state end value 58. This may for instance be done by performing an exponential fit. Other models or algorithms can also be used. Only a limited period of time until $t_{pred}$ is required for determining the steady state end value 58, instead of until 5*RC. Hence the timespan in which transient electrical values related to the first and second network are measured can be significantly smaller than 5*RC. As shown in FIG. 3b, the second timespan ($t_{pred}-t_0$) is significantly smaller than (5*RC-$t_0$). This is also valid for the first timespan during which transient electrical values related to the first network are collected. In this example, the charging phase 80a continues until time step $t_{pred}$, followed by a discharging phase 80b.

Figure 4A:
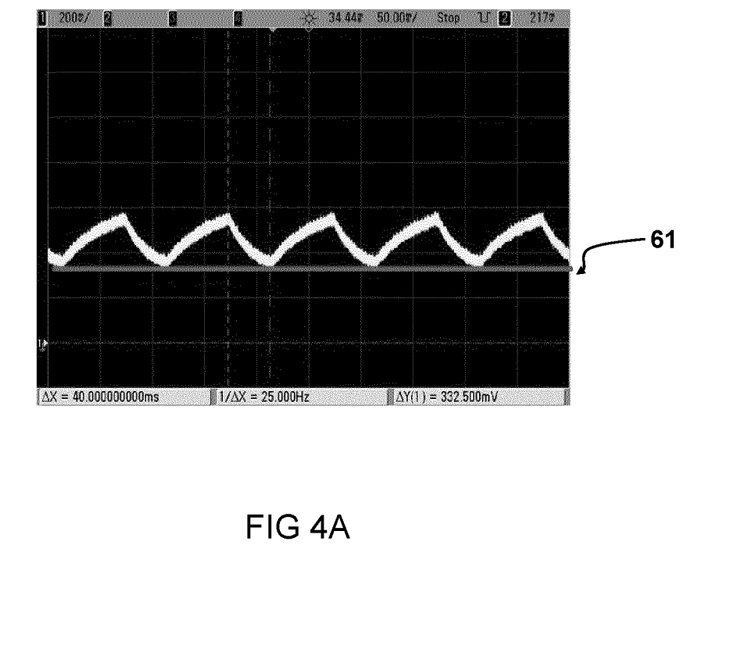
FIGS. 4a and 4b show a schematic diagram of a measured transient electrical value in function of time.
Figure 4B:
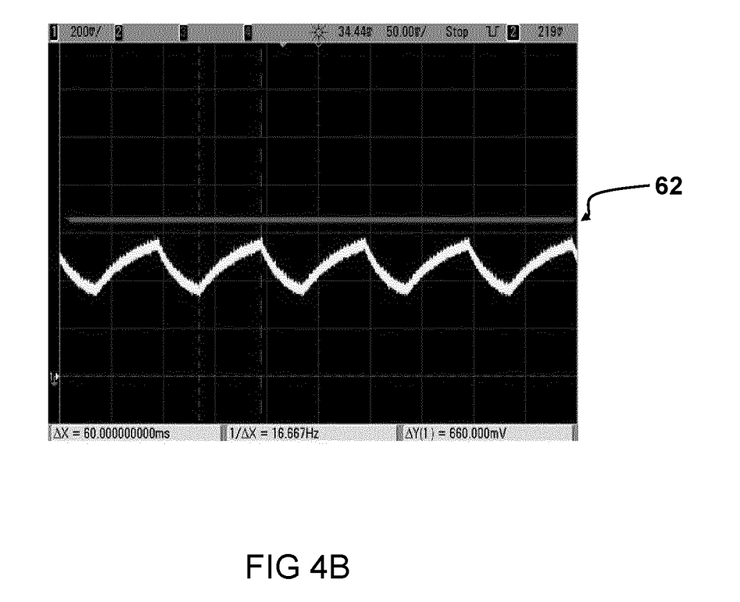

FIGS. 4a and 4b show a schematic diagram of a measured transient electrical value in function of time. Switching between connection of the terminals of the source to protective earth via the first electrical network and via the second electrical network, for example achieved by a first state ('on') and second state (off) of a switch, is to be carried out fast enough for timely detecting an insulation error while guaranteeing safety. As a result, there may not be sufficient time for waiting for the steady state value.

An asymmetric excitation may be employed. By means of an asymmetric ratio between V1 and V2, also symmetrical insulation errors can be detected. For example, insulation errors occurring as a result of degradation of insulation (natural degradation) may be symmetrical. The protective earth may for example be first excited at ⅓ of the DC line voltage during a first timespan, and ⅔ of the line voltage during a second timespan. At least two measurement cycles are needed to determine and confirm an insulation fault. In an example, multiple measurements can be performed during two power line periods with the excitation to ⅓, and two power line periods with the excitation at ⅔. Each set of measurements can form a RC curve, from which an end value can be calculated. Hence, the end value can be calculated without waiting for it to settle. Two power line periods may be sufficient for performing the measurements. The measurement time can be significantly improved in this way. For example, a 300 ms reaction time can be achieved.

In this example the insulation of a 50V DC system is monitored. Hence the excitation voltages are Vx1=16.67V and Vx2=33.33V. The excitation voltages are exemplary chosen as ⅓ of the DC grid voltage and ⅔ of the DC grid voltage. Due to capacitive loading between DC bus and PE, Vx1 indicated by line 61 in FIG. 4A, is not reached within 40 ms of excitation time, Vx2, indicated by line 62 in FIG. 4B, is not reached during its 60 ms of excitation time. However these end values can be derived by extrapolating the exponential RC curves. The end values are used for the calculation of the insulation resistance. In FIG. 4b, the value to which the voltage would converge if a sufficiently long time is waited, i.e. the steady state value 62, is never reached. The invention is not limited in this context.

A first block voltage of ⅓ of the DC source voltage may be applied for a first time duration, and a second block voltage of ⅔ of the DC source voltage may be applied for a second time duration. Hence, the potential difference of the protective earth becomes ⅓ of the potential difference between the positive and the negative terminal of the DC source. The applied voltage ratios ⅓ and ⅔ can simplify calculation of insulation resistances R1, R2. It will be appreciated that other asymmetrical ratios may also be used, for instance (¼ and ¾), (⅖, and ⅗), (⅕ and ⅘), etc. Many ratio pair combinations can be implemented.

The first timespan and the second timespan can be seen as a duration in which the protective earth is linked to the first (resistor) network and the second (resistor) network, respectively. In an example, the protective earth may be linked to one network for 60 ms, and linked to the other network for 40 ms. It can be desired to measure over several periods of time, before an alarming insulation resistance is reported. In the example in FIGS. 4a and 4b, a complete measurement for providing an indication of insulation resistances between the terminals of the source and the protective earth can be conducted within 100 ms.

Figure 5:
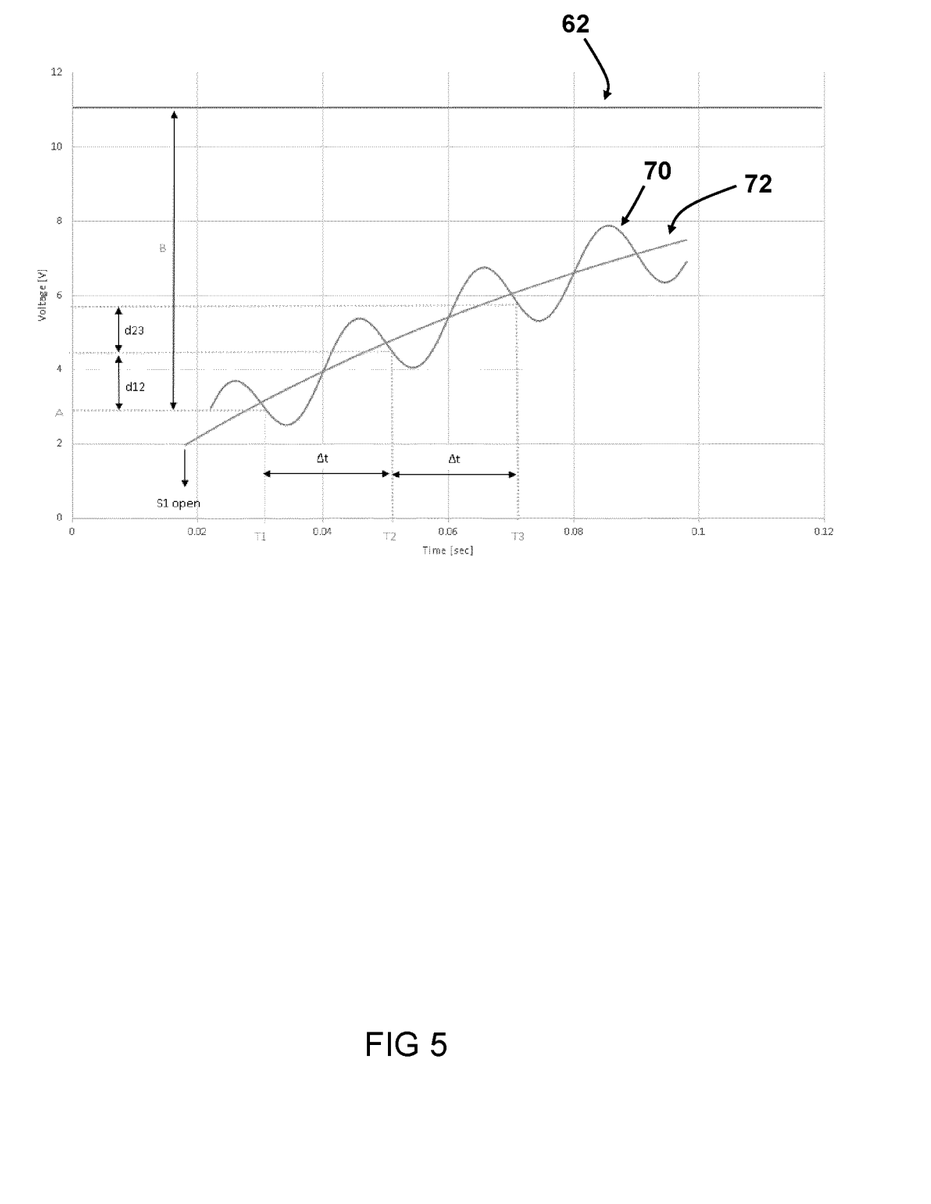
FIG. 5 shows a schematic diagram of a measured transient electrical value in function of time.

FIG. 5 shows a schematic diagram of a measured transient electrical value in function of time. The protective earth can be capacitively coupled to the AC and DC lines so the voltage on the protective earth will follow grid frequency or higher harmonics thereof. Measuring during any whole number of power line period $\Delta t$, can average out the effects of the coupled grid frequency.

As shown in FIG. 5, an oscillating signal 70 can be superposed on an exponential 72 (only a portion is drawn). The amplitudes of the oscillating signal (e.g. oscillating at 50 Hz) may be limited. However, the oscillating signal may be detrimental for the estimation of the first and second steady state value (for example using curve fitting). A relatively small oscillation can already have a significant influence on the calculated values of the insulation errors. For instance, an oscillating signal causing oscillations of ±0.1 Volt on a signal of approximately 600 Volt may already cause significant deviations between the calculated/estimated values and the actual steady state value.

This effect may even be greater if the insulation resistances become smaller (e.g. close to a limit for minimum insulation values). For small insulation resistances, the difference between V1 and V2 may become smaller. For example, in case using ⅓ and ⅔ excitation, the difference V2-V1 may no longer be ⅓ of the DC source voltage, but smaller.

The time distance between two measurement points $\Delta T$ can be chosen based on the powerline period of the AC grid to which the DC source is coupled. Errors caused by bad sampling can be prevented. In an advantageous embodiment, the distance between two time points is an integer number of times the power line period. For instance, the distance between the two time points may be one power line period for reducing the required processing time.

At least three successive measurement points may be determined for performing an estimation or predication of end values. In case of a curve fit, three measurement points may be used. More than three measurement points can also be used, for instance when employing a Lenberg-Marquart algorithm. In this example, three measurement points are used, sampled at three time steps, namely T1, T2 and T3. When the fitted curve passed through the three points T1, T2, T3 a correct trend can be obtained for determining the steady state values.

The time interval may be adjustable depending on the relevant powerline cycle. In an example, the powerline cycle is determined, for instance during initialization. A device may be configured arranged to determine or receive an indication of the powerline cycle. It is also envisaged that the powerline cycle is pre-configured and/or user selectable (e.g. Europe: 50 Hz, United States: 60 Hz).

An exponential curve fit may be performed for calculating the steady state electrical voltage value 62. The steady state electrical value may be calculated based on the following equations:

$$d_{12} = B(1 - e^{c\Delta t})$$
$$d_{23} = B - d_{12}(1 - e^{c\Delta t})$$
$$\frac{d_{12}}{d_{23}} = \frac{B}{B - d_{12}}$$
$$d_{23} \cdot B = d_{12}B - d_{12}^2$$
$$B = \frac{-d_{12}^2}{d_{23} - d_{12}}$$

It will be appreciated that a curve fitting with a larger number of measurement points are also envisaged. Many fitting algorithms can be implemented.

Figure 6:
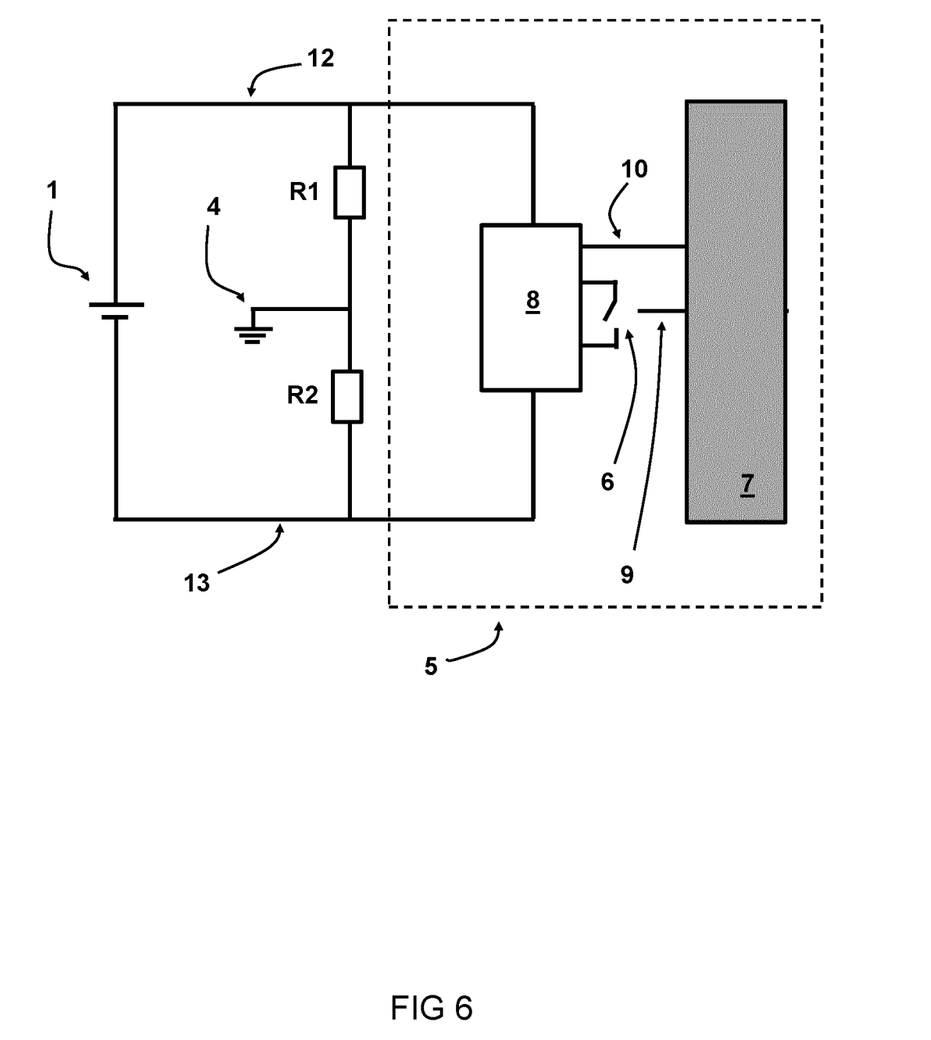
FIG. 6 shows a schematic diagram of an embodiment of an insulation monitoring device according to the invention.

FIG. 6 shows a schematic diagram of an embodiment of an insulation monitoring device according to the invention. A DC power source 1 is present, connectable to one or more loads (not shown in figure) via a DC bus comprising conductors 12 and 13. The insulation of the DC bus connected to the source 1 is schematically represented as a pair of resistors R1 and R2, between the terminals of the DC source 1 and protective earth 4. The insulation between the DC bus and protective earth 4 is influenced by the insulation of the conductors 12 and 13, and all conductors leading to loads, as well as to the insulation of DC systems comprised in these loads. The resistance values of R1 and R2 are to be determined accurately and sufficiently fast for safety purposes. The insulation monitoring device 5 can be electrically connected to the source 1. It may include a switching device 6 and a microcontroller 7, as well as an electrical circuit 8 comprising a network of resistances, capacities and/or inductors. The switching device 6 can for example be a bipolar transistor or a MOSFET, controllable by the microcontroller 7, which commands the 'on' or 'off' state of the switch 6 through connection 9. The state of the switch 6 defines the actual circuit connected to the source at any point in time. This means that by controlling the switch 6, two different electrical networks can be created.

Means are provided in the microcontroller 7 to measure a value, preferably a voltage at a particular point in the circuit. This measurement value is acquired through connection 10. The circuit is devised in such a way that two sufficiently distinct values are measured at the same point during each state (on or off) of the switch 6. If necessary, more than two values may be measured, for example one additional measurement value which is independent of the state of the switch 6, or two additional values that are dependent on the state of the switch 6, or both.

The to be determined resistance values of R1 and R2 are calculated on the basis of these at least two measurement values, combined with the network laws applied to the two different networks corresponding respectively to the switch being on or off.

The calculation of R1 and R2, according to the appropriate formulas, can be performed by the microcontroller 7. The microcontroller can be configured to check whether the values of R1 and R2 are sufficiently high. If not, an insulation failure can be detected and the terminals of the source 1 can be disconnected from any load connected to these terminals. Optionally, a pre-alarm warning signal may be activated when R1 and R2 are near the predefined alarm level, but not yet underneath said alarm level.

Any calculation of R1 and R2 takes two consecutive measurements, each during one condition (on or off) of the switch 6. A continuous monitoring can be performed by changing the condition of the switch in a sequential manner and with a given frequency.

Optionally, a main switch may be arranged for connecting or disconnecting the source 1 to the load, for example using two synchronized switches, one placed in each of the conductors of the DC bus and operated by a relay. The device can also operate an extra relay that prevents excessive inrush currents on DC bus capacitors. It can also discharge residual voltage on DC bus capacitors after switching off the main switch by operating an extra relay.

The shown device can be arranged to connect terminals of the source 1 to protective earth 4 by a first electrical network during a first timespan; and subsequently measure transient first electrical value related to the first network at a plurality of time steps in the first timespan, wherein a first steady state value is calculated using a plurality of first measurement points at the plurality of first time steps. Furthermore, the device may be configured to connect the terminals of the source to protective earth 4 by a second electrical network, during a second timespan, and subsequently measure transient second electrical values related to the second network at a plurality of second time steps in the second timespan, wherein a second steady state value is calculated using a plurality of second measurement points at the plurality of second time steps. These steps may be repeated one or more times, wherein based on the calculated steady state values of the first electrical value and the second electrical value, an indication of insulation resistances between the terminals of the source and protective earth 4 can be determined.

Figure 7:
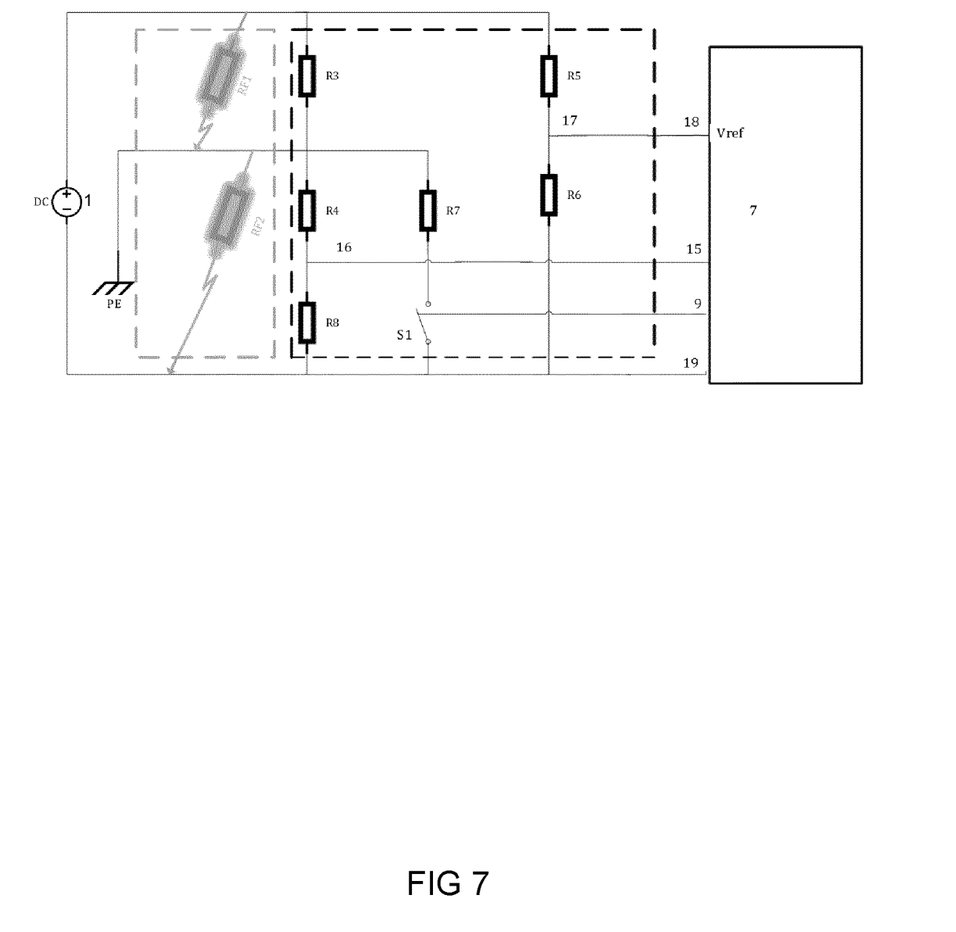
FIG. 7 shows a schematic diagram of an insulation monitoring device.

FIG. 7 shows a schematic diagram of an insulation monitoring device according to the invention. Two insulation resistances (Rf1, Rf2) representing the insulation between the DC bus terminals (positive +, negative −) of the DC source 1 and protective earth 4 have to be monitored. The switch S1 can be a MOSFET transistor. Other implementations are also possible for switching between the two electrical networks. In this embodiment, an electrical network is provided including: a resistor R3 between the positive source terminal and protective earth 4; two resistors R4 and R8 in series, between the negative source terminal and protective earth 4; a resistor R7 in series with S1 so that R7 and S1 are placed in parallel with the resistors R4 and R8; two resistors R5 and R6 in series, and as such connected to the terminals of the source 1.

When switch S1 is off, the resistor divider network comprises only the resistors R3, R4 and R8. Activation of S1 brings the parallel branch containing R7 into play. In both conditions, the microcontroller measures the voltages with respect to protective earth 4 at the position 16, which is the point between series resistors R4 and R8. This configuration as a resistor divider network allowing reduction of the measured voltage to a sufficiently low value, measurable by the microcontroller's circuits. Two consecutive voltage measurements can give two values, which are used to calculate R1 and R2, as explained after this.

A capacitive coupling between DC+ or DC− and the protective earth 4 can be created through the parasitic capacitance of for example the isolation transformer and/or electromagnetic interference decoupling capacitors in the devices connected to the DC bus. Devices known from the prior art typically employ a high impedance resistor and must perform two measurements. Combining this with capacitive effects results in either faulty measurements or a long settling time, hence a slow device. It is generally accepted that isolation monitors should react within 40 to 300 ms after an insulation fault occurs (depending on the fault magnitude) in order to protect humans.

The time constant of the parasitic capacitance and the high impedance measurement resistor is in the order of 10 ms. Further, the settling time is around 50 ms. However, as these parameters may vary considerably, practice has shown that 100 ms settling time per measurement is a good compromise in most cases. Two measurements are needed for one isolation resistance calculation, at least two or three isolation resistances should be calculated before reacting in order to create immunity against electromagnetic interference or other disturbances. It is clear that due to parasitic capacitances present in grids, the proposed isolation monitoring devices cannot react fast enough. Furthermore, grid signals may crosstalk into the protective earth. It can be likely that the protective earth carries traces of the mains voltage in the form of a voltage ripple at the mains frequency and/or one or more harmonics thereof. Filtering out these signals may slow down the acquisition of signals applied to the protective earth. The method according to the current invention can overcome these technical problems and can be implemented in various different types of isolation monitoring devices.

The protective earth is excited with two voltage levels, one after the other. A first measurement of the protective earth voltage is taken immediately at the start of the procedure, i.e. after opening the switch. A second and third measurement are taken after waiting one grid period each time. These measurements are: Vpe1.1+Vg1.1, Vpe1.2+Vg1.2, Vpe1.3+Vg1.3, with Vpe1 being the voltage on the protective earth due to the RC circuit with open switch and Vg being the superimposed sinusoidal voltage due to crosstalk from the mains.

Then the switch can be closed and measurements can be made in the same way resulting in: Vpe2.1+Vg2.1, Vpe2.2+Vg2.2, Vpe2.3+Vg2.3. As all measurements are made at the same phase angle of the grid voltage, the following is valid: Vg1.1=Vg1.2=Vg1 and Vg2.1=Vg2.2=Vg2. Further as the time for closing a solid state switch is negligible compared to the grid period, Vg1=Vg2=Vg. Vpe1.1 and Vpe1.2 are part of an exponential curve starting at Vpe1.1 and ending at the settled value for the first measurement Vpe1.

$$V = Vpe1 + A(1 - e^{-t/tau})$$

$$A = V - Vpe1$$

Rf1 and Rf2 are the insulation resistance values which are calculated. It is also envisaged that an indication of Rf1 and Rf2 is determined (for example an equivalent electrical quantity and/or a value based on a ratio of Rf1 and Rf2. The microcontroller 7 can be configured to open the switch S1 during a defined time (for example 60 milliseconds), afterwards switch S1 is closed (for example 40 milliseconds). This can be continuously repeated.

The resistances in the network can be configured such that:

$$R3 = (R4 + R8)/2 + 0.5\%$$

$$(R4 + R8)//R7 = R3/2 + 0.5\%$$

Resistance ratio $R4/R8$ = Resistance ratio $R5/R6$

The choice of resistance values R3, R4, R7 and R8 can result in excitation of the protective earth with a block voltage of ⅔ of the DC line voltage (when S1 being open) and ⅓ of the DC line voltage (when S1 being closed). When S1 is open, Vx2 can be measured at pin 15 of the microcontroller, then S1 can be closed. Vx1 can be measured with S1 being closed at point 15. The voltages Vx1 and Vx2 can be measured at point 15. In this example, to further increase noise immunity bias resistors are introduced (+0.5% of resistance value R3 and R7) such that Vx2 slightly <$\frac{2}{3}$ Vdc and Vx1 slightly >$\frac{1}{3}$ Vdc. As a result, Vx2−Vx1<Vdc/3 in all circumstances considering injected noise and component tolerances. The formulas processed by the microcontroller may be only valid in that case. The bias resistors result in a lower insulation resistance estimate (safe) when the resistance is high and are negligible in case of insulation faults. The result of the resistance division R5/R6 forms the voltage reference for the AD conversion (18) and can be <Vcc (power source) of the microcontroller.

When a fixed voltage reference is used as Vref for the AD conversion (for example 5 Volt), the 12 bits of the AD convertor (4096 are referred) to the 5 Volt fixed voltage reference. The result of the AD convertor must be converted to voltage units: Voltage units (millivolt)=4096*ADresult/5000.

When using the resistance division R5/R6 as voltage reference, the measured value of the AD convertor=$\frac{2}{3}$ or $\frac{1}{3}$ of Vdc and this measurement is referred to Vdc. There is no need for converting to voltage units. The resistance division R5/R6 as voltage reference has an additional benefit: the resolution of the AD convertor decreases: For example: Vref=2 Volt: the 12 bits of the AD convertor (4096) are referred to 2 Volt: one bit: resolution=2000/4096=0.488 mV/bit (for 5 Volt fixed voltage=5000/4096=1.22 mV bit).

Vref can be determined based on the DC voltage. Optionally, a voltage division is used for determining Vref. Vref can be proportional to the DC source voltage. It will be appreciated that the voltage supply network of the microcontroller is not drawn. Vref can become a separate input that can be used for measuring the DC source voltage.

A filter (low pass filter) can be added for the measurements of Vx2 and Vx1. The cut-off frequency of this filter must be 10 times higher than the measuring frequency (60 and 40 milliseconds). Filtering of low frequencies is not a solution, because the measurement time increase and this is not allowed.

In an example, the device switches at fixed intervals between the conditions S1 'on' and S1 'off', for example with a frequency of 10 Hz. As the steady state values are calculated (for providing a prediction), it is no longer required to perform the measurements after a given delay (e.g. 50 ms) after switching of S1 in order to allow a stable voltage to develop at the measuring location 16.

Optionally, an alarm is triggered if an insulation error is detected in one or more cycles. In an example, several measurements are taken, and an alarm is triggered if an insulation error is detected in successive cycles. A measurement of the insulation resistance can be obtained with each cycle. One cycle can be sufficient, but reliability can be increased by repeating cycles and also monitor the evolution of the insulation resistance over time.

It will be appreciated that protective earth may relate to a protective enclosure, such as a chassis of a car, as well as a real connection to earth, depending on the application.

It will be appreciated that in some applications, knowledge of the DC source voltage is desired. In such a case, electrical measurements may be done as explained above, using the reference voltage Vref, and additionally the DC source voltage can be determined with a fixed reference for being able to determine a DC source voltage expressed in Volt. The embodiments are not limited in this context.

It will be appreciated that the device can also perform other safety functions useful for dedicated applications, e.g.: under and over voltage protection, temperature measurement, self-testing, warning level indication, etc. This can be done by re-programming the micro-controller, or by using a microcontroller designed to perform additional measurements, calculations and/or actuate additional command signals for relays or the like so that values other than the insulation resistances R1 and R2 are calculated, in addition to R1 and R2. A plurality of values that are to be checked, may be calculated by the microcontroller 7, which may then activate a number of safety measures: relays for interrupting current, alarm signals, etc.

It will be appreciated that the method may include computer implemented steps. All above mentioned steps can be computer implemented steps. Embodiments may comprise computer apparatus, wherein processes performed in computer apparatus. The invention also extends to computer programs, particularly computer programs on or in a carrier, adapted for putting the invention into practice. The program may be in the form of source or object code or in any other form suitable for use in the implementation of the processes according to the invention. The carrier may be any entity or device capable of carrying the program. For example, the carrier may comprise a storage medium, such as a ROM, for example a semiconductor ROM or hard disk. Further, the carrier may be a transmissible carrier such as an electrical or optical signal which may be conveyed via electrical or optical cable or by radio or other means, e.g. via the internet or cloud.

Some embodiments may be implemented, for example, using a machine or tangible computer-readable medium or article which may store an instruction or a set of instructions that, if executed by a machine, may cause the machine to perform a method and/or operations in accordance with the embodiments.

Various embodiments may be implemented using hardware elements, software elements, or a combination of both. Examples of hardware elements may include processors, microprocessors, circuits, application specific integrated circuits (ASIC), programmable logic devices (PLD), digital signal processors (DSP), field programmable gate array (FPGA), logic gates, registers, semiconductor device, microchips, chip sets, et cetera. Examples of software may include software components, programs, applications, computer programs, application programs, system programs, machine programs, operating system software, mobile apps, middleware, firmware, software modules, routines, subroutines, functions, computer implemented methods, procedures, software interfaces, application program interfaces (API), methods, instruction sets, computing code, computer code, et cetera.

It will also be understood that, when a feature or element is referred to as being "connected", "attached" or "coupled" to another feature or element, it can be directly connected, attached or coupled to the other feature or element or intervening features or elements may be present.

The terms "first", "second", and the like, as used herein can distinguish one element from another by indicating different instances of like elements. It will be understood that terms "first", "second", and the like do not denote any order, quantity, importance, sequence, either temporally, spatially, in ranking, or in any other manner.

Furthermore, the terms "network", "circuit", "circuitry", and "controller" may include either a single component or a plurality of components, which are either active and/or passive and are connected or otherwise coupled together (for example, as one or more integrated circuit chips) to provide the described function.

Herein, the invention is described with reference to specific examples of embodiments of the invention. It will, however, be evident that various modifications, variations, alternatives and changes may be made therein, without departing from the essence of the invention. For the purpose of clarity and a concise description features are described herein as part of the same or separate embodiments, however, alternative embodiments having combinations of all or some of the features described in these separate embodiments are also envisaged and understood to fall within the framework of the invention as outlined by the claims. The specifications, figures and examples are, accordingly, to be regarded in an illustrative sense rather than in a restrictive sense. The invention is intended to embrace all alternatives, modifications and variations which fall within the spirit and scope of the appended claims. Further, many of the elements that are described are functional entities that may be implemented as discrete or distributed components or in conjunction with other components, in any suitable combination and location.

In the claims, any reference signs placed between parentheses shall not be construed as limiting the claim. The word 'comprising' does not exclude the presence of other features or steps than those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to an advantage.

The invention claimed is:

1. A method for monitoring insulation between a DC bus and protective earth, the bus being in connection with a DC source, the method comprising the steps of:
   connecting terminals of the source to protective earth by a first electrical network during a first timespan,
   measuring transient first electrical values related to the first network at a plurality of time steps in the first timespan, wherein a first steady state value is calculated using a plurality of first measurement points at the plurality of first time steps,
   connecting the terminals of the source to protective earth by a second electrical network, during a second timespan,
   measuring transient second electrical values related to the second network at a plurality of second time steps in the second timespan, wherein a second steady state value is calculated using a plurality of second measurement points at the plurality of second time steps, and
   determining an indication of insulation resistances between the terminals of the source and protective earth based on the calculated steady state values of the first electrical value and the second electrical value.

2. The method according to claim 1, wherein the first and second steady state value is calculated before the measured first and second electrical value has reached steady state in the first and second timespan, respectively.

3. The method according to claim 1, wherein the first timespan and/or the second timespan is less than three times a resistive capacitive (RC) time constant.

4. The method according to claim 1, wherein the first timespan and/or the second timespan is less than 100 ms.

5. The method according to claim 1, wherein the first steady state value is calculated from a first curve fit using the plurality of measurement points at the plurality of first time steps, and wherein the second steady state value is calculated by means of from a second curve fit using the plurality of measurement point at the plurality of second time steps.

6. The method according to claim 1, wherein a time interval between successive time steps is selected based on a power line period.

7. The method according to claim 6, wherein the time interval is selected as a multiple of the power line period.

8. The method according to claim 1, wherein three measurement points are used for each of the first curve fit and the second curve fit.

9. The method according to claim 1, wherein the first electrical value and the second electrical value are measured at a same measurement location, with respect to a same reference, wherein the excitation voltages are normalized to a DC line voltage provided by the DC source.

10. The method according to claim 1, wherein during the first timespan the protective earth is excited with a block voltage of a first fraction of the DC line voltage, and wherein during the second timespan the protective earth is excited with a block voltage of a second fraction of the DC line voltage, wherein the first fraction is different from the second fraction.

11. The method according to claim 10, wherein one or more biasing resistances are used for increasing the first fraction and decreasing the second fraction, wherein the one or more biasing resistances are configured to provide a biasing of 0.1-2%.

12. The method according to claim 1, wherein a filter is employed for measuring the first electrical value and the second electrical value, wherein the filter is a low pass filter.

13. The method according to claim 1, wherein the steady state electrical values are calculated using curve fitting only when the DC source is coupled to an AC network.

14. The method according to claim 1, wherein a switch is provided switchable between a first state and a second state, wherein in the first state the switch connects the terminals of the source to the first network, and wherein in the second state the switch connects the terminals of the source to the second network, wherein said first and second timespans are equal, and wherein the sequence of said first and second timespan is repeated with a fixed frequency, and wherein said steps of measuring, calculating and comparing are repeated with said same frequency.

15. A device for monitoring insulation between a DC bus and protective earth, the bus being in connection with a DC source, wherein the device is configured to:
   connect terminals of the source to protective earth by a first electrical network during a first timespan,
   measure transient first electrical value related to the first network at a plurality of time steps in the first timespan, wherein a first steady state value is calculated using a plurality of first measurement points at the plurality of first time steps,
   connect the terminals of the source to protective earth by a second electrical network, during a second timespan,
   measure transient second electrical values related to the second network at a plurality of second time steps in the second timespan, wherein a second steady state value is calculated using a plurality of second measurement points at the plurality of second time steps, and
   determine an indication of insulation resistances between the terminals of the source and protective earth based on the calculated steady state values of the first electrical value and the second electrical value.

16. The method of claim 7, wherein the multiple of the power line period is one power line period.

17. The method according to claim 1, wherein the determined insulation resistances are compared to predefined alarm levels, wherein an alarm action is performed when the insulation resistances exceed predetermined levels.

18. The method according to claim 1, further comprising sending a signal to a load connected to the DC source, in case of an insulation failure, for communicating said failure to remote control stations.

19. The method according to claim 1, wherein the transient first electrical value and the transient second electrical value is measured with a ratiometric A/D conversion.

20. The method according to claim 1, wherein the DC voltage of the DC source is measured.

21. The method according to claim 3, wherein the first and second timespan are chosen taking into account an estimate of the RC time constant.

22. The method according to claim 3, wherein the RC time constant is determined based on measurement points.

23. The device according to claim 16, wherein the device is configured to perform other monitoring functions.

24. The method according to claim 10, wherein the sum of the first fraction and the second fraction is substantially equal to one.

25. The method of claim 24, wherein the first fraction is ⅓ and the second fraction is ⅔.

26. The method of claim 11, wherein the biasing is 0.5-1%.

* * * * *